United States Patent
Yu et al.

(10) Patent No.: US 12,137,570 B2
(45) Date of Patent: Nov. 5, 2024

(54) THREE DIMENSIONAL MEMORY DEVICE

(71) Applicant: Taiwan Semiconductor Manufacturing Company, Ltd., Hsinchu (TW)

(72) Inventors: Chia-Ta Yu, New Taipei (TW); Chia-En Huang, Xinfeng Township (TW); Yi-Ching Liu, Hsinchu (TW); Yih Wang, Hsinchu (TW); Sai-Hooi Yeong, Zhubei (TW); Yu-Ming Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 129 days.

(21) Appl. No.: 17/566,313

(22) Filed: Dec. 30, 2021

(65) Prior Publication Data

US 2022/0328502 A1    Oct. 13, 2022

Related U.S. Application Data

(60) Provisional application No. 63/172,934, filed on Apr. 9, 2021.

(51) Int. Cl.
*H10B 51/30*   (2023.01)
*H10B 51/20*   (2023.01)

(52) U.S. Cl.
CPC ............. *H10B 51/30* (2023.02); *H10B 51/20* (2023.02)

(58) Field of Classification Search
CPC ........ H10B 51/00; H10B 51/10; H10B 51/20; H10B 51/30
See application file for complete search history.

(56) References Cited

U.S. PATENT DOCUMENTS

| | | | |
|---|---|---|---|
| 2007/0170481 A1* | 7/2007 | Kang | G11C 11/22 257/295 |
| 2010/0213458 A1* | 8/2010 | Prall | H10B 41/20 257/43 |
| 2016/0260497 A1* | 9/2016 | Harada | G11C 16/32 |
| 2019/0198109 A1* | 6/2019 | Li | H10B 41/60 |
| 2022/0285383 A1* | 9/2022 | Kubota | H01L 29/8613 |

FOREIGN PATENT DOCUMENTS

| | | | | |
|---|---|---|---|---|
| CN | 115700029 A | * | 2/2023 | ......... G11C 11/1655 |
| WO | WO-2014007941 A1 | * | 1/2014 | ......... G11C 11/5628 |
| WO | WO-2020263338 A1 | * | 12/2020 | ............ G11C 11/223 |

* cited by examiner

*Primary Examiner* — Matthew E Warren
(74) *Attorney, Agent, or Firm* — MERCHANT & GOULD P.C.

(57) ABSTRACT

A memory device includes a three dimensional memory array having memory cells arranged on multiple floors in rows and columns. Each column is associated with a bit line and a select line. The memory device further includes select gate pairs each being associated with a column. The bit line of a column is connectable to a corresponding global bit line through a first select gate of a select gate pair associated with the column and a select line of the column is connectable to a corresponding global select line through the second select gate of the select gate pair associated with the column. The plurality of select gate pairs are formed in a different layer than the plurality of memory cells.

20 Claims, 12 Drawing Sheets

THREE DIMENSIONAL MEMORY DEVICE

CROSS REFERENCE TO RELATED APPLICATION

This application claims the benefit of U.S. Provisional Application No. 63/172,934, filed Apr. 9, 2021, and titled "Three Dimensional Memory Device," the disclosure of which is hereby incorporated herein by reference.

BACKGROUND

Critical dimensions of devices in integrated circuits are shrinking to the limits of common memory cell technologies. In one trend to achieve high density, designers have been looking to techniques for stacking multiple levels of memory cells to achieve greater storage capacity and to achieve lower costs per bit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
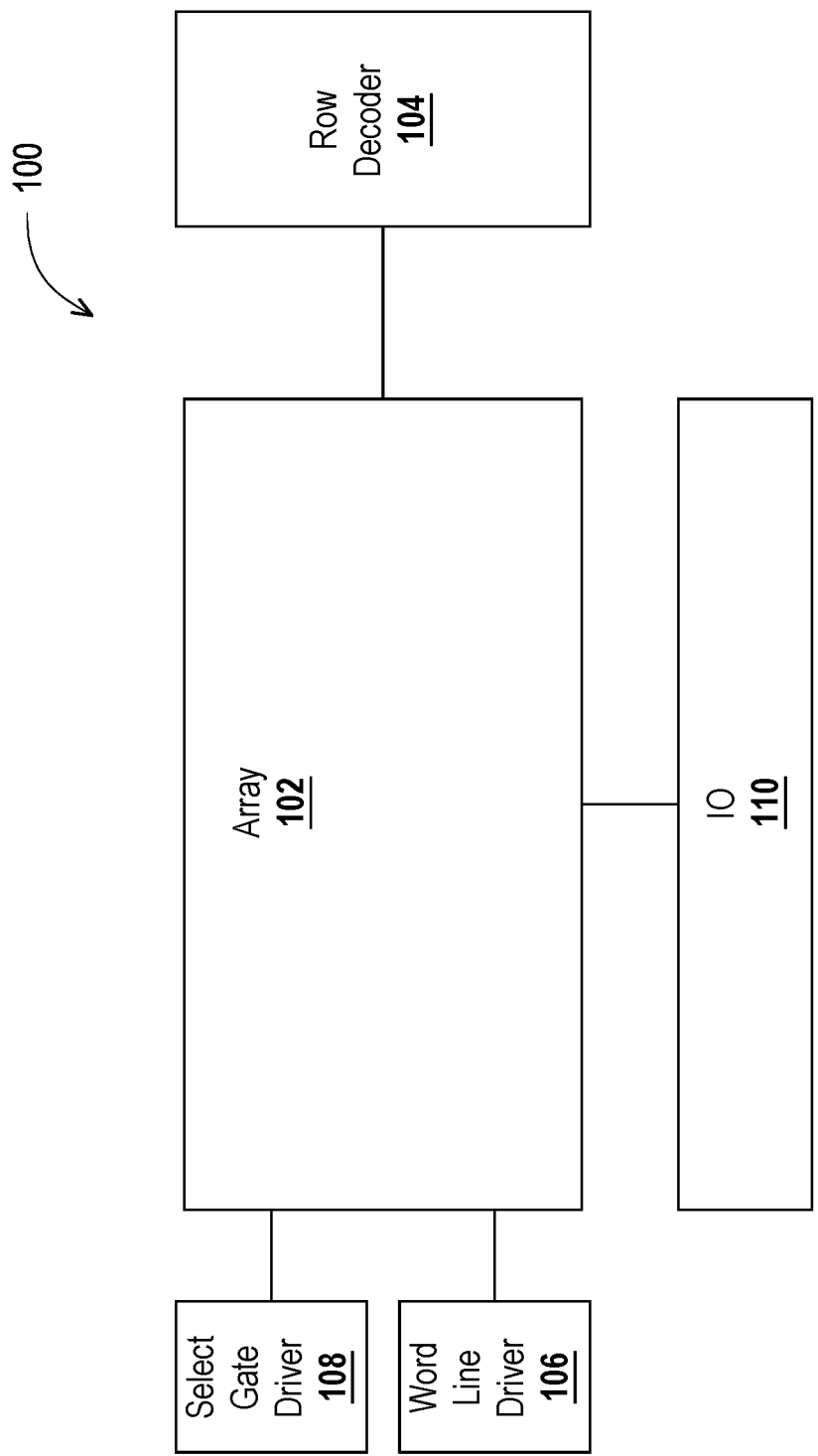
FIG. 1 illustrates a memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosure provides a three dimensional (3D) memory device. The 3D memory device is organized so that memory elements occupy multiple planes or multiple floors, forming a structure in three dimensions (i.e., in the x, y and z directions, where the y direction is substantially perpendicular and the x and z directions are substantially parallel to the major surface of the substrate). In examples, each floor in the 3D memory device is physically located in a 2D memory level (one memory level) with multiple 2D memory levels to form the 3D memory array. In other examples, the 3D memory array is physically structured as multiple vertical columns (e.g., columns extending substantially perpendicular to a major surface of the substrate in the y direction) having multiple elements in each column and therefore having elements spanning several vertically stacked memory layers. The columns are arranged in a 2D configuration, e.g., in an x-z plane, thereby resulting in a 3D arrangement of memory elements. It will be understood that other configurations of memory elements in 3D will also constitute a three dimensional memory array.

The disclosure further provides adding Select Gates (SGs) in the 3D memory device. In examples, adding the select gates to the 3D memory device reduces a leakage path and achieves energy loss reduction. For example, the select gates of a row of the 3D memory device are selectively switched on to connect bit lines and select lines of a row to corresponding global bit lines and corresponding global select lines respectively. The select gates of unselected rows remain switched off. When switched off, the select gates isolate the bit lines and the select lines of the unselected rows from the corresponding global bit lines and the corresponding global select lines thereby reducing a leakage current. The select gates are formed in a different layer from the memory cells. For example, the select gates are formed in a different silicon layer (for example, a different Inter-Metallic dielectric (IMD) layer) or a different metal layer. For example, the select gates are formed in a layer (N−1) and a layer (N+1) while the corresponding memory cells are formed in a layer (N). In another example, the select gates corresponding to select lines are formed in the layer (N+1) and the select gates corresponding to bit lines are formed in the layer (N−1) while the memory cells are formed in the layer (N). The select gates formed on different metal layers can be adopted by a planar transistor or a Fin Field Effect Transistors (FinFET) and increase manufacturing flexibility and feasibility. In examples, the select gates can be planar transistors or FinFETs.

In example embodiments, a select gate can include one or more than one transistor. When a select gate includes more than one transistor, then the transistors are connected in parallel to each other. In some examples, select gates having more transistors have higher charge transmission capability. The transistors of the select gates are controlled by a Select Signal (SS). For example, the transistors of the select gates are switched on or switched off using the select signal. In examples, the select signal is tied to or associated with a read enable signal for a read operation or a write enable signal for a write operation. For example, the select signal is enabled when the read enable signal is enabled for a read operation.

FIG. 1 is block diagram of an example memory device 100 in accordance with some embodiments. In some examples, memory device 100 is a Compute-in-Memory (CIM) device and is a 3D memory device. The CIM is used in data processing, such as multiply-accumulate ("MAC") operations. Compute-in-memory or in-memory computing systems store information in the main random-access memory (RAM) of computers and perform calculations at memory cell level, rather than moving large quantities of data between the main RAM and data store for each computation step. Because stored data is accessed much more quickly when it is stored in RAM, compute-in-memory allows data to be analyzed in real time, enabling faster reporting and decision-making in business and machine learning applications.

Memory device 100 includes a memory array 102. Memory array 102 is a 3D memory array and includes a plurality of cells. In some examples, memory array 102 is a 3D memory array having a plurality of 2D memory arrays vertically disposed over each other. In other examples, memory array 102 is a 3D memory array having a plurality of vertical 2D memory arrays disposed side by side. Memory array 102 is discussed in a greater detail with respect to FIG. 2A of the disclosure.

Figure 2A:
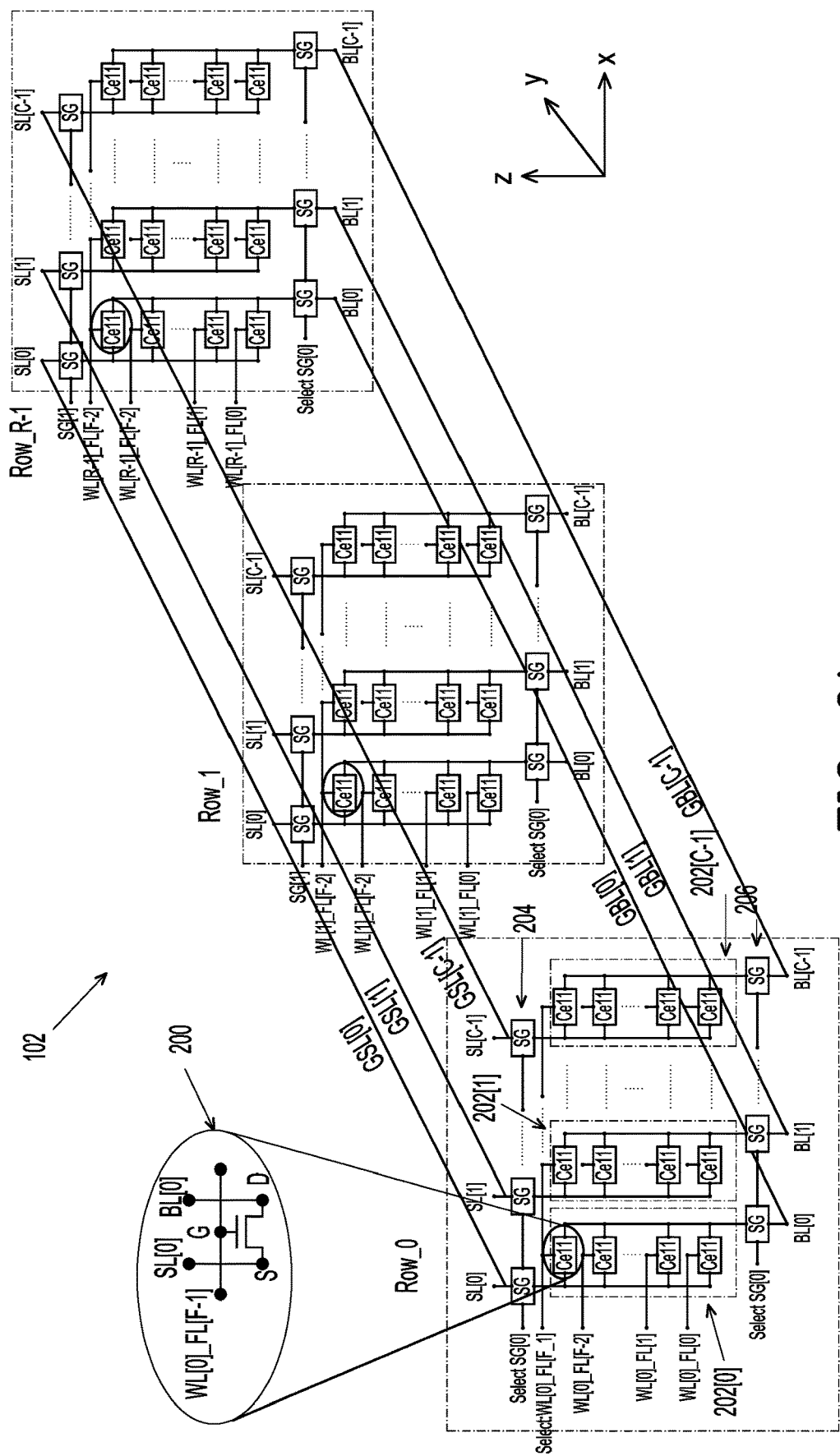
FIG. 2A illustrates a cell array of a memory device, in accordance with some embodiments.

FIG. 2A is a diagram illustrating an example three dimensional memory array 102 of memory device 100 in accordance with some embodiments. Memory array 102 in some embodiments includes memory cells arranged in a three-dimensional array extending in a first (x), second (y) and third (z) dimension. Each memory cell is connected to one of the weight input lines (such as a word line (WL), one of the input lines (such as a source line (SL)), and one of the output lines (such as a bit line (BL). In some embodiments, the WLs extend in the second dimension and are distributed in the first and third dimensions; the BLs and SLs extend in the third dimension and distributed in the second and third dimensions.

Memory array 102 includes a plurality of memory cells 200. In some embodiments, each of memory cells 200 includes a one-transistor (1T) memory cell, such as a 1T ferroelectric random-access memory (FeRAM) element. Other types of memory cells can also be used. In some embodiments, memory array 102 is adapted to store in each memory cell, one bit of data, for example, a weight value transmitted from the respective weight input lines, receive input signals from the input lines, and simultaneously output signals to the BLs.

In examples, memory array 102 is disposed in metal layers (sometimes referred to as the "back end of the line" (BEOL)). For example, memory device 100 includes an active semiconductor region, which can be an active layer in a semiconductor substrate and include one or more semiconductor devices, such as sense amplifiers. This region is sometimes referred to as the "front end of the line," or "FEOL," region. Memory array 102 is formed above the active semiconductor region. That is, memory array 102 in this example is formed in a region sometimes referred to as the "back end of the line," or "BEOL," region, at levels where the metal lines for memory device 100 are formed.

Memory cells 200 are arranged in a matrix of a plurality of rows (labeled as Row_0, Row_1, . . . , Row_R-1), columns (labeled as 202[0, 202[1], . . . , 202[c-1]), and floors (also referred to as layers). Hence, each memory cell 200 (r, c, l) is indexed by the row (r), column (c), and layer (l) the memory cell occupies in three-dimensional array. In the example shown in FIG. 2A, r ranges from 0 to R-1, c ranges from 0 to C-1, and l ranges from 0 to F-1, where R, C, and F are integers. In some embodiments memory cells 200 are single-transistor ("1T") memory cells, such as ferroelectric random-axis memory ("FeRAM") cells. As shown in FIG. 2A, such 1T memory cells in some embodiments have gate (G), source (S), and drain (D), with a ferroelectric material in the gate insulation layer. The polarization of the gate insulation layer can be switched by a voltage between the gate on the one hand, and source and drain on the other, above a threshold voltage. The polarization state of the ferroelectric layer represents the stored value (binary 0 or 1) and determines the source-drain resistance when transistor 200 is subsequently turned on (by a gate-source or gate-train voltage sufficient to turn transistor 200 on but below the threshold voltage). The gate of each memory cell 200 is connected to a word line WL(r, l); the source of each memory cell 200 is connected to a source line SL(r, c); and the drain of each memory cell 200 is connected to a bit line BL(r, c). Memory cells 200 in the same row (r) and layer (l) share the same word line WL(r, l) (also labeled as WL[0]_ [FL] in FIG. 2A); memory cells 200 in the same row (r) and column (c), i.e., in the same one-dimensional array in the z-direction, share the same source line SL(r, c) and a bit line BL(r, c).

Continuing with FIG. 2A, memory array 102 comprises a plurality of select gate pairs (for example, first select gates 204 arranged in a two-dimensional array (R×C in this example), and second select gates 206 arranged in another two-dimensional array (R×C in this example)). Each first select gates 204(r, c) switchably connects the select line SL(r,c) for memory cells 200(r, c) in the one-dimensional array at row r and column c to a select line SL(c); the select lines SL(c) for all one-dimensional arrays in column c are connected to a common global select line GSL(c). Likewise, each second select gates 206(r, c) switchably connects the bit line BL(r,c) for memory cells 200(r, c) in the one-dimensional array at row r and column c to a bit line BL(c); the bit lines BL(c) for all one-dimensional arrays in column c are connected to a common global bit line GBL(c). The gates of all first select gates 204(r) in the same row r are connected to a common select gate line SG(r); applying an ON signal to the select gate line SG(r) thus connects all select line SL(r) in the same row r and all columns c to their respective global select lines GSL(c). Likewise, the gates of all second select gates 206(r) in the same row r are connected to a common select gate line SG(r); applying an ON signal to the select gate line SG(r) thus connects all bit line BL(r) in the same row r and all columns c to their respective global bit lines GBL(c). In some embodiments, the select gate lines SG(r) for each row r are connected to each other or supplied with identical signals. In such a case, the select line SL(r, c) for each one-dimensional array located at row r and column c is connected to, or disconnected from, the respective global select line GSL(r) for the row r at the same time as the bit line BL(r, c) for the same one-dimensional array is connected to, or disconnected from, the respective global bit line GBL(r) for the row r. In some embodiments, each global bit line GBL(c) is connected to a respective sense amplifier ("SA").

Figures 2B, 2C:
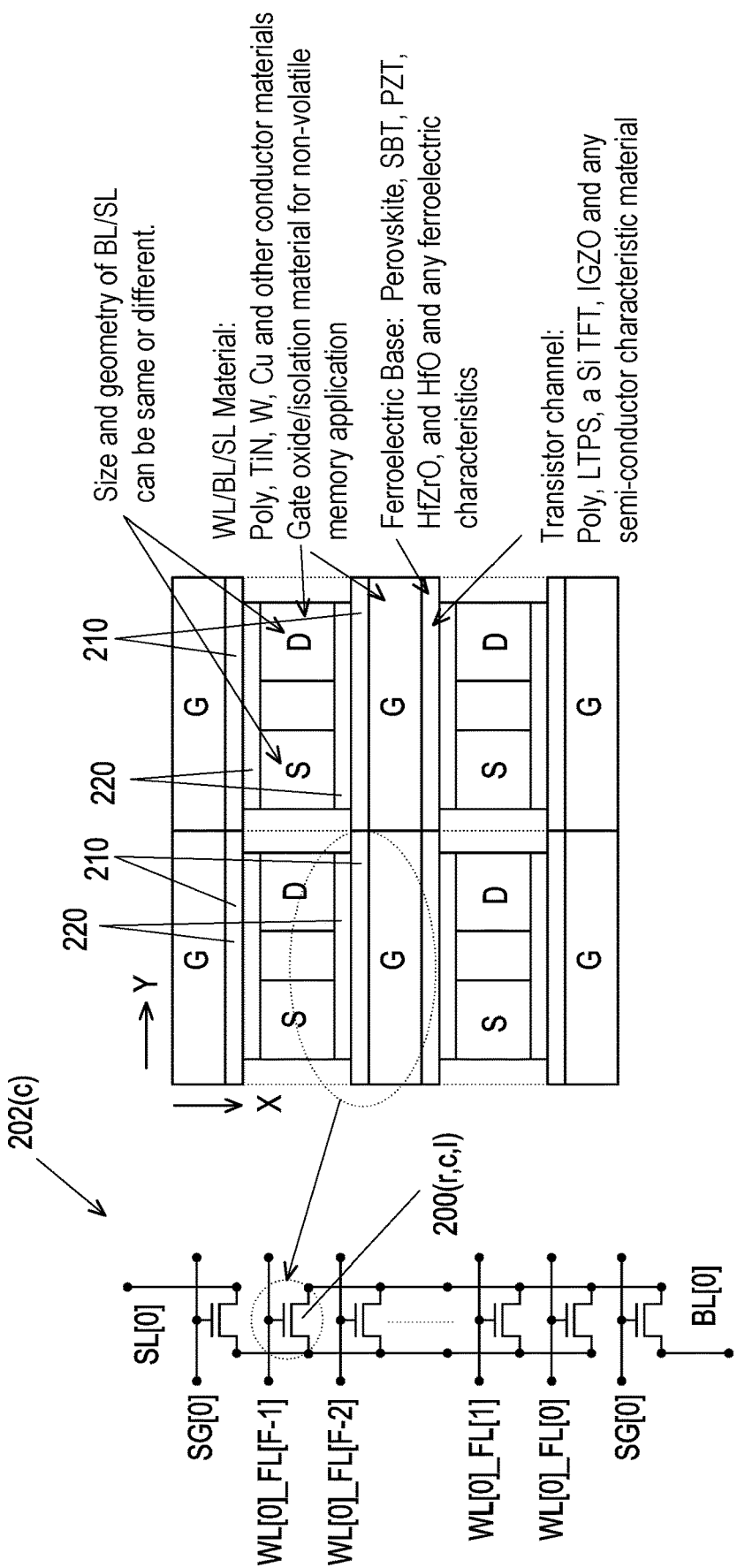
FIG. 2B illustrates schematically shows the memory cells in a given column and row of the memory array, in accordance with some embodiments.
FIG. 2C schematically shows the physical structure of a portion of the memory cells shown in FIG. 2B, in accordance with some embodiments.

In some embodiments, as shown in FIGS. 2B and 2C, memory cells 200 are formed in the metal layers, i.e., BEOL, above an active semiconductor region. In this example, each single-transistor memory cell 200 includes a stacked structure including, in sequence, a gate G (or WL), a gate oxide/isolation layer 210, a transistor channel layer 220, and a source (S (or SL))/drain (D or (DL)) layer. All layers are formed during the process of forming the metal layers in the BEOL region. The gate G, source S, and drain can be formed by any suitable conductive material, including polysilicon ("poly"), TiN, W, and Cu. Gate oxide/isolation layer 210 can be made of any suitable material for nonvolatile memory including ferroelectric materials, such as perovskite, SBT, PZT, HfZrO, and HfO. Semiconductor channel layer 220 can be made of any suitable semiconductor material, including poly, LTPS, a-Si TFT, IGZO.

In examples, and as mentioned above, a bit line and a select line of a column is connected to a corresponding global bit line and a corresponding select line through a select gate pair associated with the column. For example, select line SL[c] of column 202[c] is connectable to global select line GSL[c] through first select gate 204[c] and bit line BL[c] is connectable to global bit line GBL[c] through second select gate 206[c]. In examples, a first terminal of second select gate 206[c] is connected to bit line BL[c] and a second terminal of second select gate 206[c] is connected to global bit line GBL[c]. Similarly, a first terminal of first select gate 204[c] is connected to select line SL[c] and a second terminal of first select gate 204[c] is connected to global select line GSL[c]. When switched on second select gate 206[c] connects bit line BL[c] to global bit line GBL[c] and when switched on first select gate [c] connects select line SL[c] to global select line GSL[c]. First select gate 204[c] and second select gate 206[c] are selectively switched on through the select signal for a read operation or a write operation. It will be apparent to a person with skill in the art after reading this disclosure that each of first select gate 204[c] and second select gate 206[c] are symmetrical, that is, the first terminal and the second terminal of each of first select gate 204[c] and second select gate 206[c] are interchangeable.

Referring back to FIG. 1, memory device 100 further includes a row decoder 104 (also referred to as a layer decoder 104). Row decoder 104 is configured to decode a portion of an address provided to memory device 100 to determine a row on which cells addressed by the address is disposed. In some examples, each row of memory array 102 is associated with a row decoder 104. Each row decoder 104 is configured to decode a portion of the address to determine if the address corresponds to cells on its row. In some examples, row decoder 104 is formed in the FEOL region.

Memory device 100 further includes a word line driver 106. Word line driver 106 is configured to operate cooperatively with row decoder 104 to select and drive (that is, assert and de-assert) one of the plurality of word lines disposed in one of the plurality of rows. In some examples, a word line driver 106 may be disposed on each of the plurality of rows and is operative to drive one of the plurality of word lines disposed on its row. Additionally, each word line driver 106 is configured to drive one of the plurality of word lines disposed on its row when row decoder 104 disposed on its row determines that the address corresponds to cells on its row and the partial address decoder selects a word line on the same row. In some examples, word line driver 106 is formed in the FEOL region.

Memory device 100 further includes a select gate driver 108. Select gate driver 108 is configured to operate cooperatively with word line driver 106 to drive one or more of select gate pairs associated with a row. In some examples, a select gate driver 108 may be disposed on each of the plurality of rows. In examples, select gate driver 108 is formed in the FEOL region.

Memory device 100 further include an Input/Output (IO) 108. IO 110 is configured to read data from or write data into array 102. In some examples, IO 110 can include a sense amplifier, a data in circuit, a data out circuit, etc. In some examples, IO 110 is formed in the FEOL region.

Figure 3:
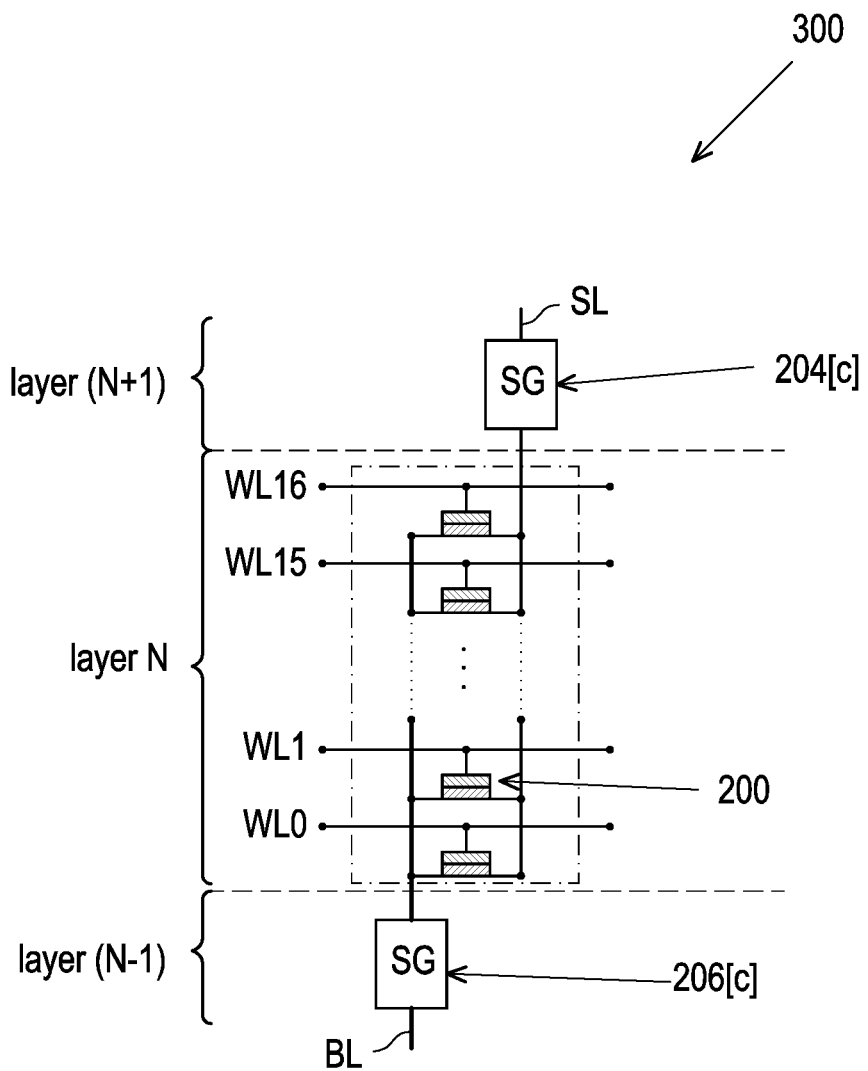
FIG. 3 is a diagram illustrating a first example of select gates formation, in accordance with some embodiments.

In examples, the select gate pairs are formed in a different layer than those of memory cells 200. FIG. 3 is a diagram 300 illustrating a first example of select gates formation in accordance with some examples. Diagram 300 illustrates an example [c]th column 202[c] of memory array 102 of memory device 100. As illustrated in diagram 300 of FIG. 3, each of first select gate 204[c] and second select gate 206[c] is formed in a different layer (for example, a different metal layer) than that of memory cells 200. For example, first select gate 204[c] is formed in a layer above (that is, in the layer (N+1)) from memory cells 200 that are formed in the layer (N). Additionally, second select gate 206[c] is formed in a layer below (that is, in the layer (N−1)) from memory cells 200 that are formed in the layer (N). In some examples, first select gate 204[c] is formed in a layer below (that is, in the layer (N−1)) and second select gate 206[c] is formed in a layer above (that is, in the layer (N+1)) from memory cells 200 that are formed in the layer (N).

Figure 4:
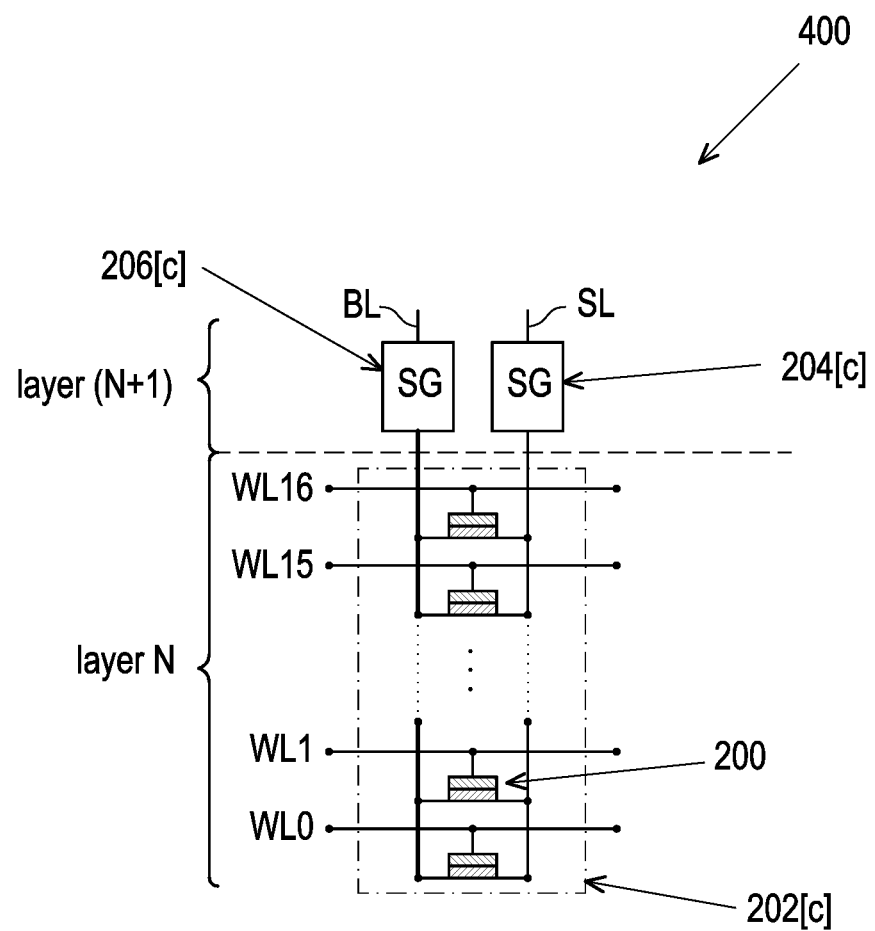
FIG. 4 is a diagram illustrating a second example of select gates formation, in accordance with some embodiments.
Figure 5:
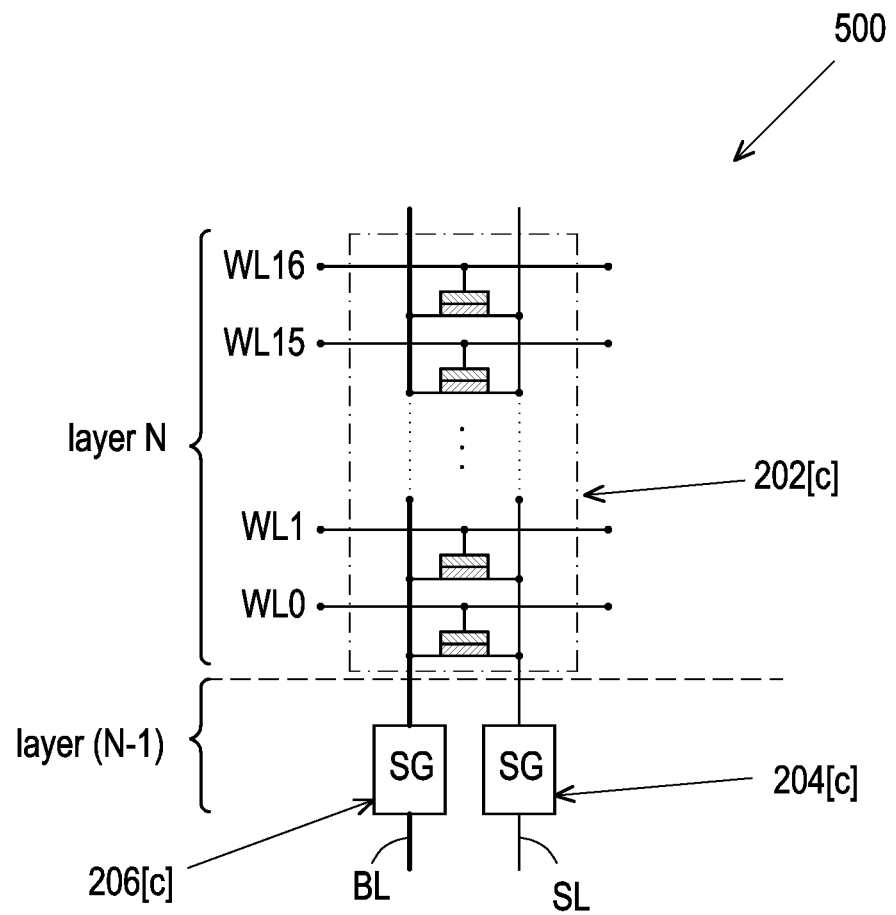
FIG. 5 is a diagram illustrating a third example of select gates formation, in accordance with some embodiments.

In other example embodiments, both first select gate 204[c] and second select gate 204[c] are formed in a same layer but in a different layer from memory cells 200. For example, and as shown in diagram 400 of FIG. 4, both first select gate 204[c] and second select gate 206[c] of column 202[c] are formed in a layer above (that is, in the layer (N+1)) from memory cells 200 that are formed in the layer (N). In an alternative example, and as shown in diagram 500 of FIG. 5, both first select gate 204[c] and second select gate 206[c] are formed in a layer below (that is, in the layer (N−1)) from memory cells 200 of column 202[c] that are formed in the layer (N).

Figure 6:
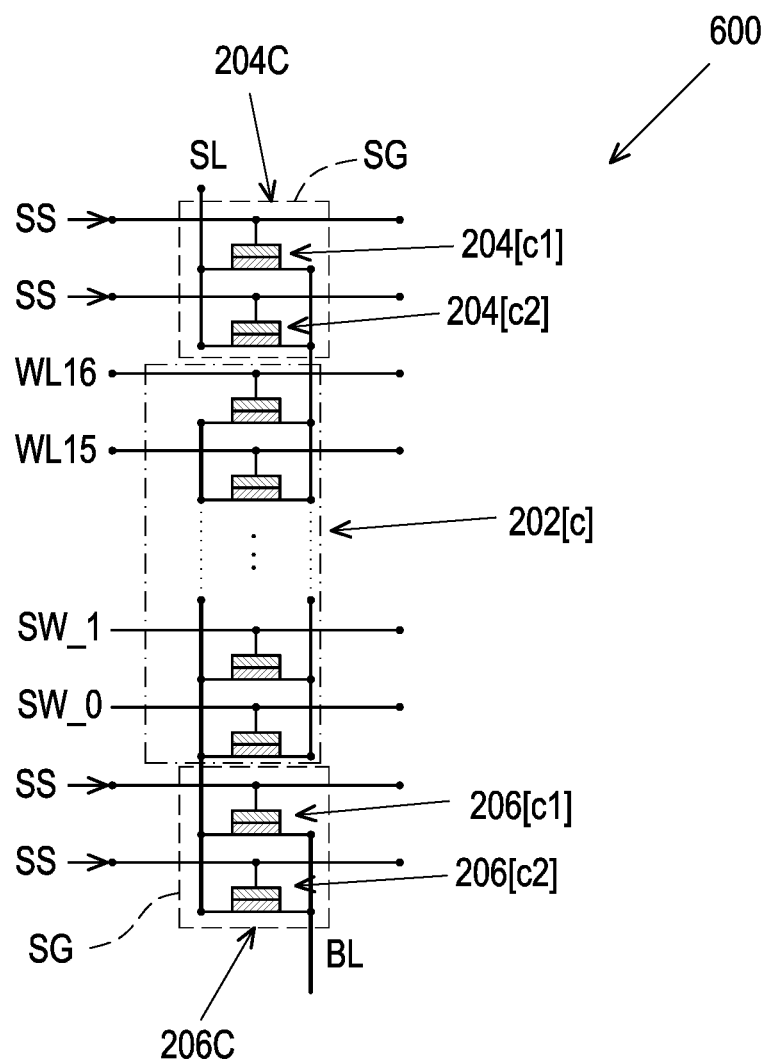
FIG. 6 is a diagram illustrating components of select gates, in accordance with some embodiments.

In example embodiments, each of first select gate 204 and second select gate 206 includes a plurality of transistors. For example, and as shown in diagram 600 of FIG. 6, first select gate 204[c] includes a first select gate first transistor 204[c1] and a first select gate second transistor 204[c2]. Similarly, second select gate 206[c] includes a second select gate first transistor 206[c1] and a second select gate second transistor 206[c2]. Although, each of first select gate 204[c] and second select gate 206[c] are shown to include only two transistors, it will be apparent to a person with an ordinary skill in the art after reading this disclosure that each of first select gate 204[c] and second select gate 206[c] can include more than two transistors. A higher number of transistors results in a higher charge transmission capability for first select gates 204 and second select gates 206.

In examples, first select gate first transistor 204[c1] and first select gate second transistor 204[c2] of first select gate 204[c] are connected in parallel to each other. A gate of each of first select gate first transistor 204[*c1*] and first select gate second transistor 204[*c2*] is connected to the select gate line or to the select gate signal (represented as SS). Similarly, second select gate first transistor 206[*c1*] and second select gate second transistor 206[*c2*] are connected parallel to each other. For example, a gate of each of second select gate first transistor 206[*c1*] and second select gate second transistor 206[*c2*] of second select gate 206[*c*] is connected to the select gate line or to the select gate signal. The select gate lines provide the select signals which switches on and switches off each of first select gate 204[*c*] and second select gate 206[*c*].

In examples, the select signal is associated with the word line signals (represented as SW). For example, for a read operation in memory array 102, a word line is selected and charged to a logic high (or a logic 1). Since, the select signal is tied to the word line signal, or a read enable signal, the select signal also rises to a logic high when the word line is charged to a logic high. When the select signal rises to a logic high, the select gates are switched on connecting the associated bit lines and the associated select lines to the corresponding global bit lines and the corresponding global select lines respectively.

Figure 7:
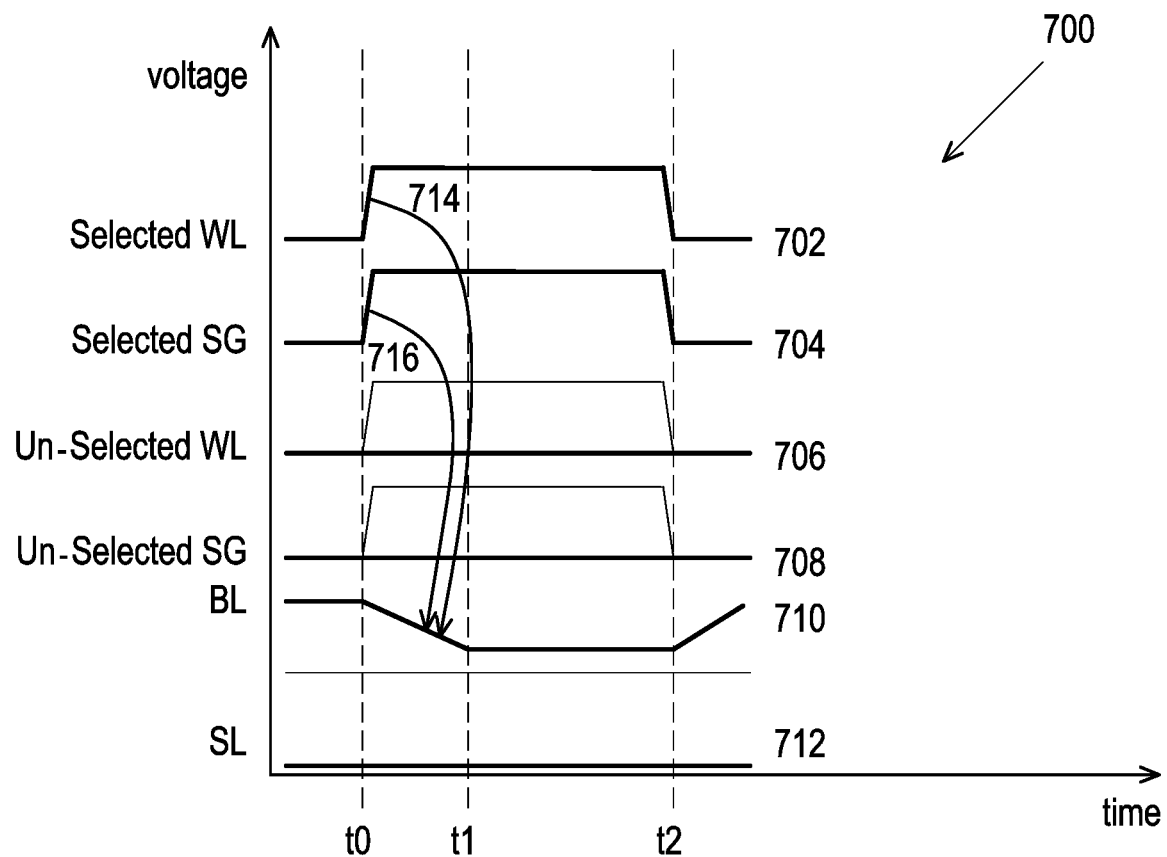
FIG. 7 is an example graph illustrating signals of the memory device, in accordance with some embodiments.

FIG. 7 illustrates voltage levels of different signals of memory device 100 during a read operation in accordance with some embodiments. For example, a first plot 702 illustrates the voltage level of the word line signal of a selected word line, a second plot 704 illustrates the voltage level of the select gate signal of a selected select gate, a third plot 706 illustrates the voltage level of the world line signal for an unselected word line, a fourth plot 708 illustrates the voltage level of the select gate signal for an unselected select gate, a fifth plot 710 illustrates the voltage level for the bit line, and a sixth plot 712 illustrates the voltage level for the select line.

As shown in first plot 702, the voltage level of the word line signal rises to a logic high for the selected word line at a time t0 when the selected word line is asserted. In some examples, the word line is asserted for the read operation. In addition, and as shown in second plot 704, when the word line is asserted, the select signal for the select gate associated with the selected word line is also asserted (that is, charged to the logic high) at the time t0. However, and as shown in third plot 706, the voltage level of an unselected word line signal remains at a logic low. In addition, and as shown in fourth plot 708, the voltage level of an unselected select line associated the unselected word line also remains at a logic low.

As indicated by first arrow 714 and second arrow 716, charging of both of the word line signal and the select line signal triggers discharging of the bit line at the time t0. For example, the bit line is de-asserted for the read or write operation at the time t0 and starts discharging after being de-asserted. The voltage level of the bit line drops to a minimum value at a time t1. The voltage level of the select line, as shown in sixth plot 712, remains at a logic low throughout the read or write operation.

The word line is de-asserted at the completion of the read or write operation. For example, and as shown in first plot 702, the word line is de-asserted at time t2 and the voltage level of the word line signal falls to the logic low for the selected word line. In addition, and as shown in second plot 704, when the word line is de-asserted, the select signal for the select gate associated with the selected word line is also de-asserted and the voltage level of the select signal falls to the logic low at the time t2. Moreover, and as shown in fifth plot 710, the de-assertion of the word line triggers charging of the bit line to the logic high.

Figure 8:
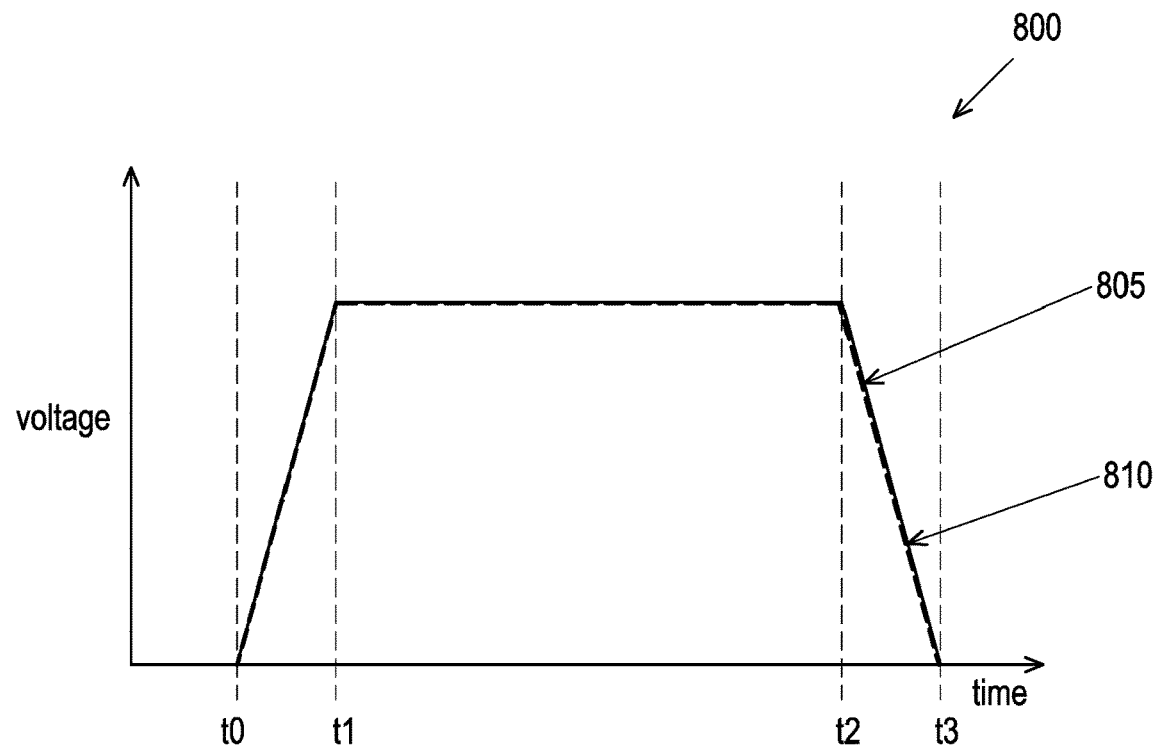
FIG. 8 is a first example graph illustrating voltage levels of select signal and word line signal, in accordance with some embodiments.

FIG. 8 is a first example graph 800 illustrating an association between the voltage levels of the select signal and word line signal. For example, a first plot 805 of graph 800 illustrates the select signal and second plot 810 of graph 800 illustrate the word line signal. As illustrated in graph 800 both, the select signal and the word line signal has a substantially same voltage profile. That is, both the select signal and the word line signal are asserted at a same time (that is, time t0), reach a maximum voltage level at a same time (that is, time t1), are de-asserted at a same time (that is, time t2), and reach a minimum voltage level at a same time (that is, time t3) after being de-asserted.

Figure 9:
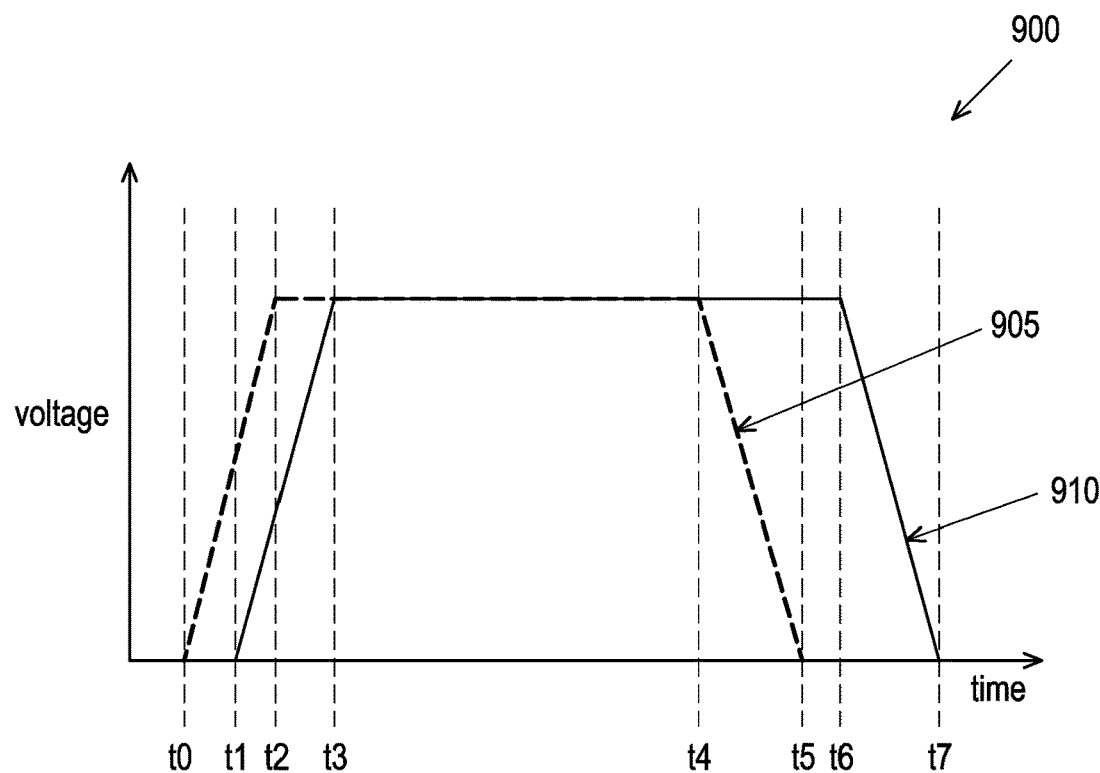
FIG. 9 is a second example graph illustrating voltage levels of select signal and word line signal, in accordance with some embodiments.

In some examples, the select signal is asserted before asserting the word line signal. FIG. 9 is a second example graph 900 illustrating another association between the voltage levels of the select signal and word line signal where the select signal is asserted before asserting the word line signal. For example, a first plot 905 of graph 900 illustrates the select signal and second plot 910 of graph 900 illustrate the word line signal. As illustrated in graph 900, the select signal is asserted at a time t0 while the word line signal is asserted at a time t1, which a predetermined time period after assertion of the select signal at the time t0. In addition, the select signal reaches a maximum voltage level at a time t2 while the word line signal reaches the maximum voltage level at a time t3, which is after the select signal reaching the maximum voltage level at the time t2.

Continuing with graph 900 of FIG. 9, the select signal is de-asserted at a time t4 and reaches a minimum voltage level at a time t5. The word line signal, however, is de-asserted at a time t6, which is after de-assertion of the select signal at the time t4. Additionally, the word line signal reaches the minimum voltage level a time t7, which is after the select signal reaches the minimum voltage level at the time t6.

Figure 10:
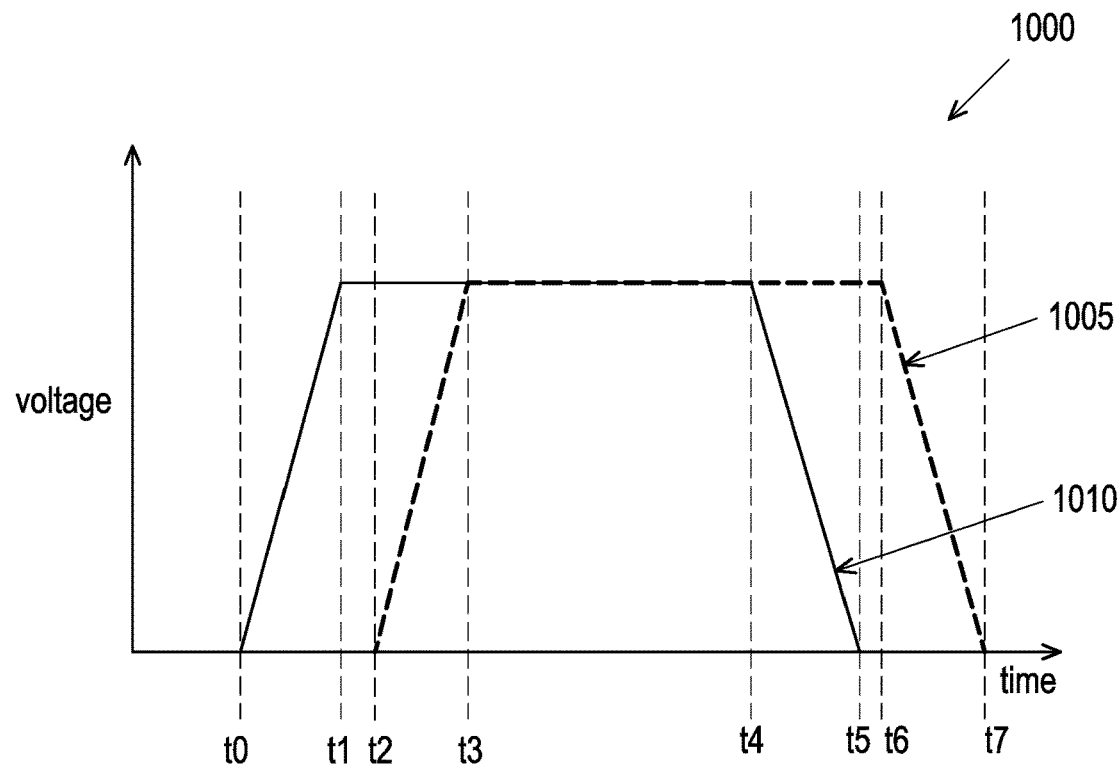
FIG. 10 is a third example graph illustrating voltage levels of select signal and word line signal, in accordance with some embodiments.

In some examples, the select signal is asserted after assertion of the word line signal. FIG. 10 is a third example graph 1000 illustrating voltage levels of the select signal and word line signal when the select signal is asserted after assertion of the word line signal. For example, a first plot 1005 of graph 1000 illustrates the select signal and second plot 1010 of graph 1000 illustrate the word line signal. As illustrated in graph 1000, the select signal is asserted at a time t2 which is after a time t0 when the word line signal is asserted. In addition, the select signal reaches a maximum voltage level at a time t3 while the word line signal reaches the maximum voltage level at a time t1, which is before the select signal reaching the maximum voltage level at the time t3. Continuing with graph 1000, the select signal is de-asserted at a time t6 which is after a time t4 when the word line signal is de-asserted. Additionally, the select signal reaches a minimum voltage level at a time t7 which is after a time t5 when the word line signal reaches the minimum voltage level.

Figure 11:
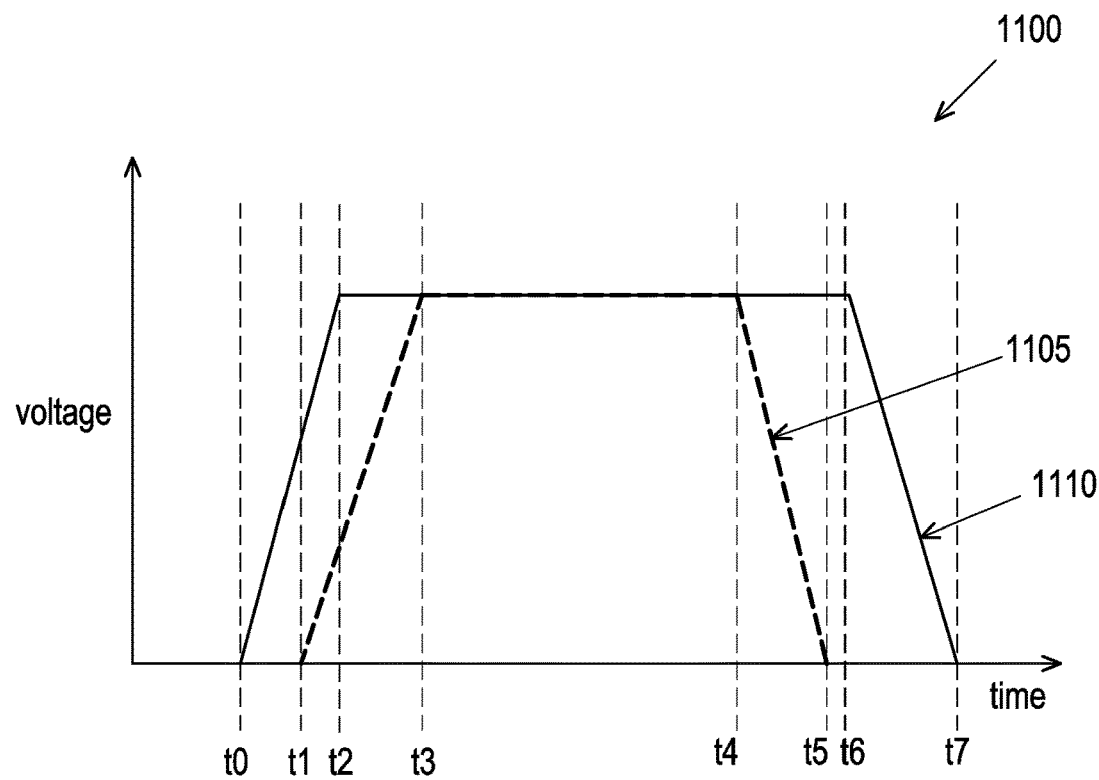
FIG. 11 is a fourth example graph illustrating voltage levels of select signal and word line signal, in accordance with some embodiments.

In example embodiments, the select signal is asserted after assertion of the word line signal and is de-asserted before the de-assertion of the word line signal. For example, the word line signal is asserted for initiating a read operation and is de-asserted after the conclusion of the read operation. FIG. 11 is a fourth example graph 1100 illustrating voltage levels of the select signal and word line signal when the select signal is asserted after assertion of the word line signal and is de-asserted before the de-assertion of the word line signal. For example, a first plot 1105 of graph 1100 illustrates the select signal and second plot 1110 of graph 1100 illustrate the word line signal. As illustrated in graph 1100, the select signal is asserted at a time t1 which is after assertion of the word line signal at a time t0. In addition, the select signal reaches a maximum voltage level at a time t3 which is after a time t2 when the word line signal reaches the maximum voltage level.

Continuing with graph 1100, the select signal is de-asserted at a time t4 which is before de-assertion of the word line signal at the time t6. Moreover, the select signal reaches a minimum voltage level at a time t5 which is also before the word line signal reaches the minimum voltage level a time t7.

Figure 12:
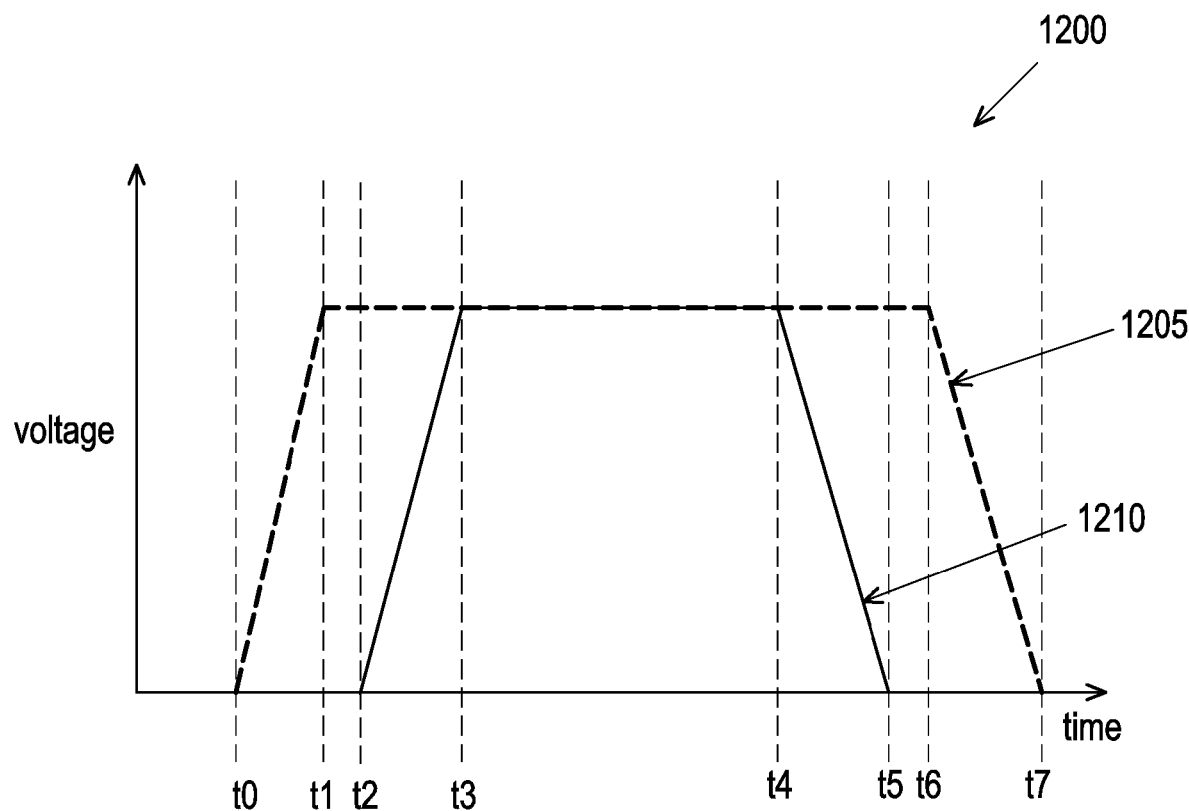
FIG. 12 is a fourth example graph illustrating voltage levels of select signal and word line signal, in accordance with some embodiments.

In example embodiments, the select signal is asserted before assertion of the word line signal and is de-asserted after the de-assertion of the word line signal. FIG. 12 is a second example graph 1200 illustrating voltage levels of the select signal and word line signal when the select signal is asserted before assertion of the word line signal and is de-asserted after de-assertion of the word line signal. For example, a first plot 1205 of graph 1200 illustrates the select signal and second plot 1210 of graph 1200 illustrate the word line signal. As illustrated in graph 1200, the select signal is asserted at a time t0 which is before assertion of the word line signal at a time t2. In addition, the select signal reaches a maximum voltage level at a time t1 while the word line signal reaches the maximum voltage level at a time t3, which is after the select signal reaching the maximum voltage level at the time t1. Continuing with graph 1200, the select signal is de-asserted at a time t6 which is after the word line signal being de-asserted at a time t4. In addition, the select signal is a minimum voltage level a time t7, which is after the word line signal reaching the minimum voltage level at the time t5.

Figure 13:
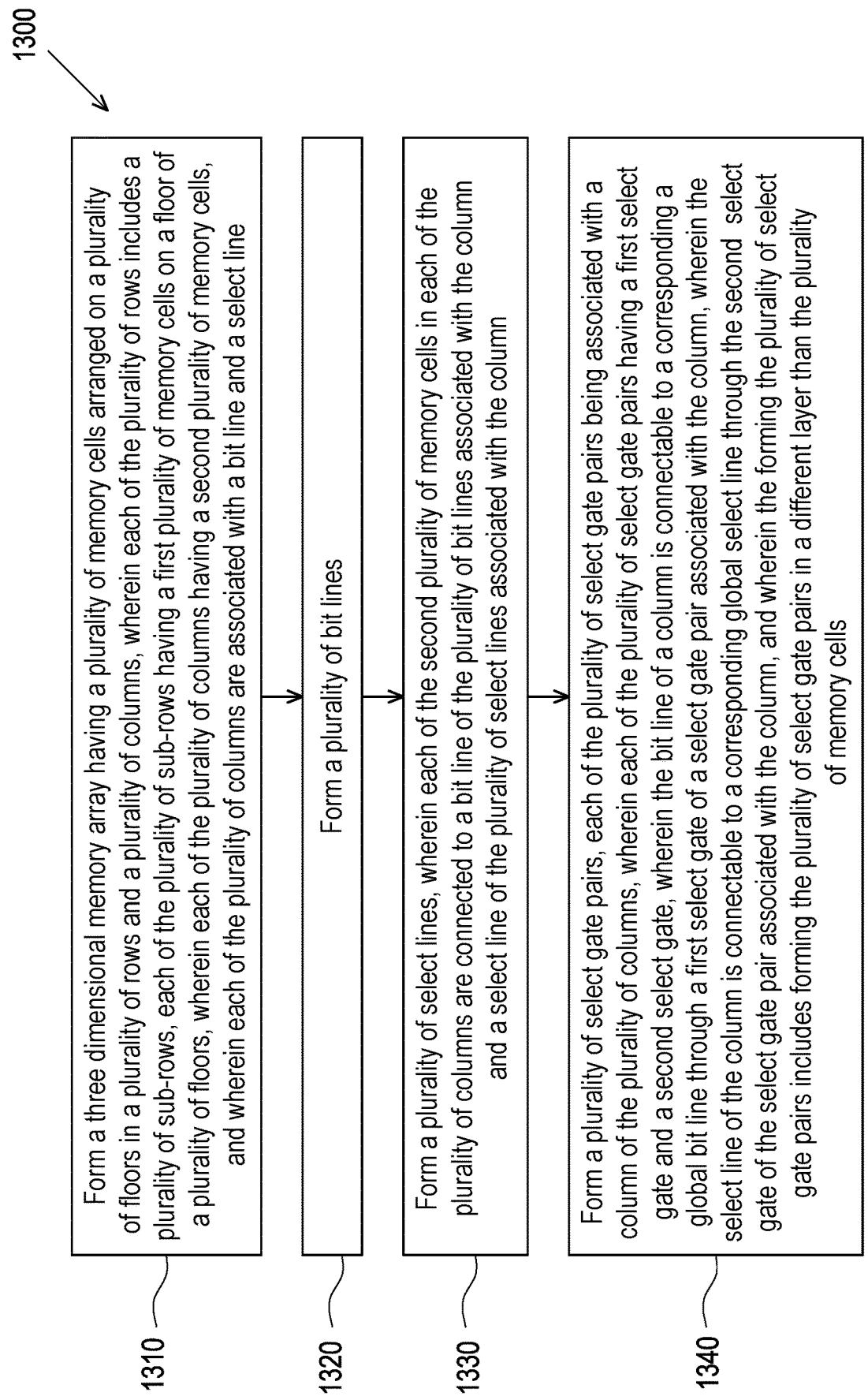
FIG. 13 is a flow diagram illustrating a method of forming a memory device, in accordance with some embodiments.

FIG. 13 is flow diagram of a method 1300 for operating a memory device in accordance with some embodiments. For example, method 1300 may be used for operating memory device 100 discussed in reference to FIGS. 1-12. In some examples, method 1300 may be performed by a computer system having a memory and a processor connected to the memory. In other examples, method 1300 may be stored in form of instruction on a memory which then is executed by a processor connected to the memory to perform method 1300.

At block 1310 of method 1300, three dimensional memory array 102 is formed. Three dimensional array 102 includes memory cells 200 arranged on a plurality of layers in a plurality of rows (labeled as Row_0, Row_1, . . . , and Row_R-1) and a plurality of columns 200. Each of the plurality of rows include a plurality of sub-rows which include a first plurality of memory cells. Each of the plurality of columns comprising a second plurality of memory cells.

At block 1320 of method 1300, a plurality of bit lines are formed. For example, bit lines labeled as BL[0], BL[1], . . . , and BL[C-1] are formed. At block 1330 of method 1300, a plurality of select lines are formed. For example, select lines labeled as SL[0], SL[1], . . . , and SL[C-1] are formed. Each of the second plurality of memory cells of a column of the plurality of columns are connected to a bit line of the plurality of bit lines associated with the column and a select line of the plurality of select line associated with the column.

At block 1340 of method 1300, a plurality of select gate pairs are formed. Each of the plurality of select gate pairs are associated a column of the plurality of columns. The plurality of select gate pairs include first select gates 204 and second select gates 206. The bit line of the column is connectable to a global bit line through the first select gate of a select gate pair associated with the column. The select line of the column is connectable to a corresponding global select line through the second select gate of the select gate pair associated with the column. In examples, the plurality of select gate pairs are formed in a different layer than memory cells 200.

In examples, the bit lines and the select line are selectively connected to the corresponding global bit lines and the corresponding global select lines during a read or write operation. Rest of the time, the bit lines and the select line are disconnected from the corresponding global bit lines and the corresponding global select lines thereby limiting leakage in memory device 100.

In example embodiments, a memory device comprises: a three dimensional memory array comprising a plurality of memory cells arranged in a three-dimensional array extending in a first (x), second (y) and third (z) dimensions in a plurality of rows and a plurality of columns, wherein each of the plurality of columns are associated with a bit line and a select line; and a plurality of select gate pairs, each of the plurality of select gate pairs being associate with a column of the plurality of columns, and wherein each of the plurality of select gate pairs comprising a first select gate and a second select gate, wherein the bit line of a column is connectable to a corresponding a global bit line through a first select gate of a select gate pair associated with the column, wherein the select line of the column is connectable to a corresponding global select line through the second select gate of the select gate pair associated with the column, wherein the first select gate and the select gates are formed in a different layer than the plurality of memory cells.

In some embodiments, a three dimensional memory device comprises: a plurality of floors, each of the plurality of floors comprising a plurality of memory cells; a plurality of rows, wherein each of the plurality of rows comprises multiple memory cells of the plurality of memory cells, the multiple memory cells arranged in a plurality of sub-rows, wherein each of the plurality of sub-rows comprises a first plurality of memory cells; a plurality of word lines, wherein each of the plurality of word lines is connected to the first plurality of memory cells in a sub-row of the plurality of sub-rows of a row; a plurality of select gate pairs, each of the plurality of select gate pairs comprising a first select gate and a second select gate, wherein the plurality of select gate pairs are formed in a different layer than the plurality of memory cells; a plurality of columns, wherein each of the plurality of columns comprising a second plurality of memory cells, wherein each column of the plurality of columns in associated with a bit line, a select line and a select gate pair of the plurality of select gate pairs, wherein the bit line is connected to each of the second plurality memory cells in the column, wherein each of the bit line is connectable to a corresponding global bit line through the first select gate of the select gate pair associated with the column, wherein the select line is connected to each of the second plurality memory cells in the column, and wherein the select line is connectable to a corresponding global select line through the second select gate of the select gate pair associated with the column.

In example embodiments, a method of forming a memory three dimensional memory device, the method comprises: forming a three dimensional memory array comprising a plurality of memory cells arranged on a plurality of floors in a plurality of rows and a plurality of columns, wherein each of the plurality of rows comprises a plurality of sub-rows, each of the plurality of sub-rows comprising a first plurality of memory cells on a floor of a plurality of floors, wherein each of the plurality of columns comprising a second plurality of memory cells; forming a plurality of bit lines; forming a plurality of bit lines, wherein each of the second plurality of memory cells of a column of the plurality of columns are connected to a bit line of the plurality of bit lines associated with the column and a select line of the plurality of select line associated with the column; and forming a plurality of select gate pairs, each of the plurality of select gate pairs being associated a column of the plurality of columns, wherein each of the plurality of select gate pairs comprising a first select gate and a second select gate, wherein the bit line of the column is connectable to a corresponding a global bit line through the first select gate of a select gate pair associated with the column, wherein the select line of the column is connectable to a corresponding global select line through the second select gate of the select gate pair associated with the column, and wherein the forming the plurality of select gate pairs comprises forming the plurality of select gate pairs in a different layer than the plurality of memory cells.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
   a three dimensional memory array comprising a plurality of memory cells arranged in a three-dimensional array extending in a first (x), second (y) and third (z) dimensions in a plurality of rows and a plurality of columns, wherein each of the plurality of columns are associated with a bit line and a select line; and
   a plurality of select gate pairs, each of the plurality of select gate pairs being associated with a column of the plurality of columns, wherein each of the plurality of select gate pairs comprises a first select gate and a second select gate, wherein the bit line of a column is connectable to a corresponding a global bit line through a first select gate of a select gate pair associated with the column, wherein the select line of the column is connectable to a corresponding global select line through the second select gate of the select gate pair associated with the column, and wherein the plurality of select gate pairs are formed in a layer above the plurality of memory cells.

2. The memory device of claim 1, wherein each of the first gate and the second gate comprises a Fin Field Effect Transistor (FinFET).

3. The memory device of claim 1, wherein both the first select gate and the second select gate comprises a plurality of transistors.

4. The memory device of claim 3, wherein the plurality of transistors are connected in parallel.

5. The memory device of claim 1, wherein the first gate and the second gate are switched on for a read operation.

6. The memory device of claim 1, wherein each of the first plurality of memory cells of a sub-row of the plurality of sub-rows is connected to a word line.

7. A three dimensional memory device comprising:
   a plurality of floors, each of the plurality of floors comprising a plurality of memory cells;
   a plurality of rows, wherein each of the plurality of rows comprises multiple memory cells of the plurality of memory cells, the multiple memory cells of each row of the plurality of rows are arranged in a plurality of sub-rows, wherein each of the plurality of sub-rows comprises a first plurality of memory cells;
   a plurality of word lines, wherein each of the plurality of word lines is connected to the first plurality of memory cells in a sub-row of the plurality of sub-rows;
   a plurality of select gate pairs, each of the plurality of select gate pairs comprising a first select gate and a second select gate, wherein the plurality of select gate pairs are formed in a layer above the plurality of memory cells;
   a plurality of columns, wherein each column of the plurality of columns comprises a second plurality of memory cells, wherein a column of the plurality of columns is associated with a bit line, a select line, and a select gate pair of the plurality of select gate pairs, wherein the bit line is connected to each of the second plurality memory cells in the column, wherein the bit line is connectable to a corresponding global bit line through the first select gate of the select gate pair associated with the column, wherein the select line is connected to each of the second plurality memory cells in the column, and wherein the select line is connectable to a corresponding global select line through the second select gate of the select gate pair associated with the column.

8. The three dimensional memory device of claim 7, wherein both the first select gate and the second select gate comprises a plurality of transistors.

9. The three dimensional memory device of claim 8, wherein the plurality of transistors are connected in parallel.

10. The three dimensional memory device of claim 7, wherein each of the first gate and the second gate comprises a Fin Field Effect Transistor (FinFET).

11. The three dimensional memory device of claim 7, wherein the first gate and the second gate are switched on for a read operation and a write operation.

12. The three dimensional memory device of claim 7, wherein the first gate and the second gate are switched on through a select signal.

13. The three dimensional memory device of claim 12, wherein the select signal is associated with a read enable signal and a write enable signal.

14. A memory device comprising:
   a three dimensional memory array comprising a plurality of memory cells arranged in a three-dimensional array extending in a first (x), second (y) and third (z) dimensions in a plurality of rows and a plurality of columns, wherein each of the plurality of columns are associated with a bit line and a select line; and
   a plurality of select gate pairs, each of the plurality of select gate pairs being associated with a column of the plurality of columns, wherein each of the plurality of select gate pairs comprises a first select gate and a second select gate, wherein the bit line of a column is connectable to a corresponding a global bit line through a first select gate of a select gate pair associated with the column, wherein the select line of the column is connectable to a corresponding global select line through the second select gate of the select gate pair associated with the column, wherein the plurality of select gate pairs are formed in a different layer than the plurality of memory cells, and wherein both the first select gate and the second select gate comprises a plurality of transistors.

15. The memory device of claim 14, wherein the plurality of transistors are connected in parallel.

16. The memory device of claim 14, wherein each of the plurality of transistors is a Fin Field Effect Transistor (Fin-FET).

17. The memory device of claim 14, wherein the first select gate is formed in a layer above the plurality cells and the second select gate is formed in a layer below the plurality of memory cells.

18. The memory device of claim 14, wherein both the first select gate and the second select gates are formed in a layer above the plurality cells.

19. The memory device of claim 14, wherein both the first select gate and the second select gates are formed in a layer below the plurality cells.

20. The memory device of claim 14, wherein the first gate and the second gate are switched on through a select signal that is associated with a read enable signal and a write enable signal.

* * * * *